(12) United States Patent
Sundararajan et al.

(10) Patent No.: US 8,468,510 B1
(45) Date of Patent: Jun. 18, 2013

(54) OPTIMIZATION OF CACHE ARCHITECTURE GENERATED FROM A HIGH-LEVEL LANGUAGE DESCRIPTION

(75) Inventors: Prasanna Sundararajan, San Jose, CA (US); Andrew R. Putnam, Seattle, WA (US); David W. Bennett, Silverthorne, CO (US)

(73) Assignee: Xilinx, Inc., San Jose, CA (US)

( * ) Notice: Subject to any disclaimer, the term of this patent is extended or adjusted under 35 U.S.C. 154(b) by 999 days.

(21) Appl. No.: 12/508,404

(22) Filed: Jul. 23, 2009

Related U.S. Application Data

(63) Continuation-in-part of application No. 12/009,272, filed on Jan. 16, 2008.

(51) Int. Cl.
*G06F 9/45* (2006.01)
*G06F 13/00* (2006.01)
*G06F 13/28* (2006.01)

(52) U.S. Cl.
USPC .......................................... 717/152; 711/118

(58) Field of Classification Search
USPC ........................................................ 717/152
See application file for complete search history.

(56) References Cited

U.S. PATENT DOCUMENTS

| | | | |
|---|---|---|---|
| 6,370,622 B1 | 4/2002 | Chiou et al. | |
| 6,631,447 B1 | 10/2003 | Morioka et al. | |
| 7,017,014 B2 | 3/2006 | Cuomo et al. | |
| 7,315,991 B1 | 1/2008 | Bennett | |
| 7,325,232 B2 | 1/2008 | Liem | |
| 7,565,631 B1 * | 7/2009 | Banerjee et al. | 716/103 |
| 7,664,928 B1 | 2/2010 | Andrews et al. | |
| 7,689,972 B2 | 3/2010 | Sah et al. | |
| 7,784,037 B2 | 8/2010 | Chen et al. | |
| 8,156,481 B1 * | 4/2012 | Koh et al. | 717/151 |
| 8,180,964 B1 * | 5/2012 | Koh et al. | 711/118 |
| 2003/0187935 A1 | 10/2003 | Agarwalla et al. | |
| 2004/0030832 A1 | 2/2004 | Squibbs | |
| 2004/0073630 A1 | 4/2004 | Copeland et al. | |
| 2004/0148474 A1 | 7/2004 | Cuomo et al. | |
| 2005/0055675 A1 | 3/2005 | Neifert et al. | |
| 2005/0204316 A1 | 9/2005 | Nebel et al. | |

(Continued)

OTHER PUBLICATIONS

U.S. Appl. No. 12/009,272, filed Jan. 16, 2008, Sundararajan et al.

(Continued)

*Primary Examiner* — Li B Zhen
*Assistant Examiner* — Arshia S Kia
(74) *Attorney, Agent, or Firm* — W. Eric Webostad; LeRoy D. Maunu; Lois D. Cartier

(57) ABSTRACT

Approaches for generating a hardware specification from a high-level language (HLL) program. In one approach, a method determines separate accesses in the HLL program to multiple consecutively addressed data items. The HLL program is compiled into an intermediate language program to include one or more instructions that perform functions on the multiple consecutively addressed data items and one or more memory access instructions that reference the consecutively addressed data items. The method generates a hardware specification from the intermediate language program. The hardware specification includes a cache memory that caches the consecutively addressed data items and that accesses the consecutively addressed data items in response to a single access request. The specification further includes one or more hardware blocks that implement the functions of the instructions in the intermediate language program. At least one of hardware blocks has access to the multiple consecutively addressed data items in parallel.

16 Claims, 10 Drawing Sheets

U.S. PATENT DOCUMENTS

| | | |
|---|---|---|
| 2005/0251657 A1 | 11/2005 | Boucher |
| 2005/0268271 A1* | 12/2005 | Gutberlet et al. ............... 716/18 |
| 2005/0273752 A1* | 12/2005 | Gutberlet et al. ............... 716/18 |
| 2006/0136664 A1 | 6/2006 | Trika |
| 2007/0047126 A1 | 3/2007 | Kobayashi et al. |
| 2007/0261042 A1 | 11/2007 | Chen et al. |
| 2008/0127146 A1 | 5/2008 | Liao et al. |
| 2008/0155574 A1 | 6/2008 | Gohel et al. |
| 2008/0177975 A1 | 7/2008 | Kawamura |
| 2008/0229291 A1 | 9/2008 | Chen et al. |
| 2008/0244506 A1* | 10/2008 | Killian et al. ................. 717/100 |
| 2008/0307332 A1 | 12/2008 | Hayles et al. |
| 2009/0106256 A1 | 4/2009 | Safari et al. |
| 2010/0153654 A1 | 6/2010 | Vorbach et al. |

OTHER PUBLICATIONS

U.S. Appl. No. 12/508,437, filed Jul. 23, 2009, Sundararajan et al.

Ang, Boon Seong et al., *ACRES Architecture and Compilation*, HPL-2003-209(R.1), Apr. 2, 2004, pp. 1-82, available from Hewlett Packard Company, Palo Alto, California, USA.

Putnam, Andrew et al., "CHiMPS: A High-Level Compilation Flow for Hybrid CPU/FPGA Architectures," *Proc. of the 16th International ACM/SIGDA Symposium on Field-Programmable Gate Arrays*, Feb. 24-26, 2008, pp. 261-269, Monterey, California, USA.

* cited by examiner

OPTIMIZATION OF CACHE ARCHITECTURE GENERATED FROM A HIGH-LEVEL LANGUAGE DESCRIPTION

RELATED PATENT DOCUMENTS

This patent document claims the benefit under 35 U.S.C. §120 of U.S. patent application Ser. No. 12/099,272, filed Jan. 16, 2008, and entitled: "GENERATION OF CACHE ARCHITECTURE FROM A HIGH-LEVEL LANGUAGE DESCRIPTION," which is fully incorporated herein by reference.

FIELD OF THE INVENTION

The present invention generally relates to generating a many-cache hardware architecture from a high-level language program description.

BACKGROUND

Programmable logic devices (PLDs), such as field programmable gate arrays (FPGAs), have been used to increase the data processing speed for various computing applications requiring high performance. Such applications have some functions implemented as software that executes on a processor ("software functions") and other functions implemented as circuits on a PLD ("hardware functions"). A performance increase is achieved from functions being performed much faster as circuits than those functions could be performed as software.

The ability to specify both the software functions and hardware functions of a high-performance computing application in a high-level language (HLL) such as C, C++, or Java, for example, significantly simplifies the task of the application designer since many of the implementation details of the underlying PLD may be hidden from the designer. In combination with known compilers, a tool such as that described in U.S. Pat. No. 7,315,991, entitled "Compiling HLL into Massively Pipelined Systems," by Bennett, may be used to develop and implement a high-performance computing application with hardware functions on a PLD. The Bennett approach generates a data-driven pipelined system for implementation on a PLD.

The interdependency of the software functions and hardware functions on data accessed by the functions, in combination with the differences between a microprocessor memory model and a data driven model, may limit the effectiveness of implementing some of the functions from the HLL program as hardware functions. Generally, in a microprocessor memory model, input data to be operated by a microprocessor is available for access according to a memory hierarchy: non-volatile memory, volatile RAM, and one or more levels of cache. In contrast, in a data driven model, the data to be operated on by a circuit in the pipeline is generally not available for random access. Rather, the data arrives sequentially in one or more data streams. In some instances, the data dependencies between the hardware and software functions may cause those functions to have to wait for data.

The present invention may address one or more of the above issues. The following paragraphs are provided as background for PLDs on which hardware functions may be implemented.

PLDs are a well-known type of integrated circuit that can be programmed to perform specified logic functions. One type of PLD, the field programmable gate array (FPGA), typically includes an array of programmable tiles. These programmable tiles may include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that may include, for example, function generators, registers, arithmetic logic, and so forth.

The programmable interconnect and programmable logic are typically programmed by loading configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that interconnects the various elements on the device. These PLDs are known as mask programmable devices. PLDs can also be implemented in other ways, e.g., using fuse or antifuse technology. The terms "PLD" and "programmable logic device" include but are not limited to these example devices, as well as encompassing devices that are only partially programmable. For example, one type of PLD includes a combination of hard-coded transistor logic and a programmable switch fabric that programmably interconnects the hard-coded transistor logic.

SUMMARY

The present invention provides various embodiments for generating a hardware specification from a high-level language (HLL) program. In one embodiment, a method comprises determining separate accesses in the HLL program to at least two consecutively addressed data items. The HLL program is compiled into an intermediate language program, and the intermediate language program includes one or more instructions that perform a respective function on the at least two consecutively addressed data items and includes one or more memory access instructions that reference the at least two consecutively addressed data items. A hardware specification is generated from the intermediate language program. The hardware specification specifies a cache memory that caches the at least two consecutively addressed data items and that accesses the at least two consecutively addressed data items in response to a single access request. The hardware specification further specifies one or more respective hardware blocks that implement the respective function of the one or more instructions in the intermediate language program. At least one of the one or more hardware blocks has access to the at least two consecutively addressed data items in parallel.

In another embodiment, an article of manufacture comprises a processor-readable storage medium configured with instructions for generating a hardware specification from a high-level language (HLL) program. The instructions when executed by one or more processors cause the one or more processors to perform the operations including determining separate accesses in the HLL program to at least two consecutively addressed data items. The operations further include compiling the HLL program into an intermediate language program. The intermediate language program includes one or more instructions that perform a respective function on the at least two consecutively addressed data items and one or more memory access instructions that reference the at least two consecutively addressed data items. A hardware specification is generated from the intermediate language program. The hardware specification specifies a cache memory that caches the at least two consecutively addressed data items and that accesses the at least two consecutively addressed data items in response to a single access request. Further specified are one or more respective hardware blocks that implement the respective function of the one or more instructions in the intermediate language program. At least one of the one or more hardware blocks has access to the at least two consecutively addressed data items in parallel.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
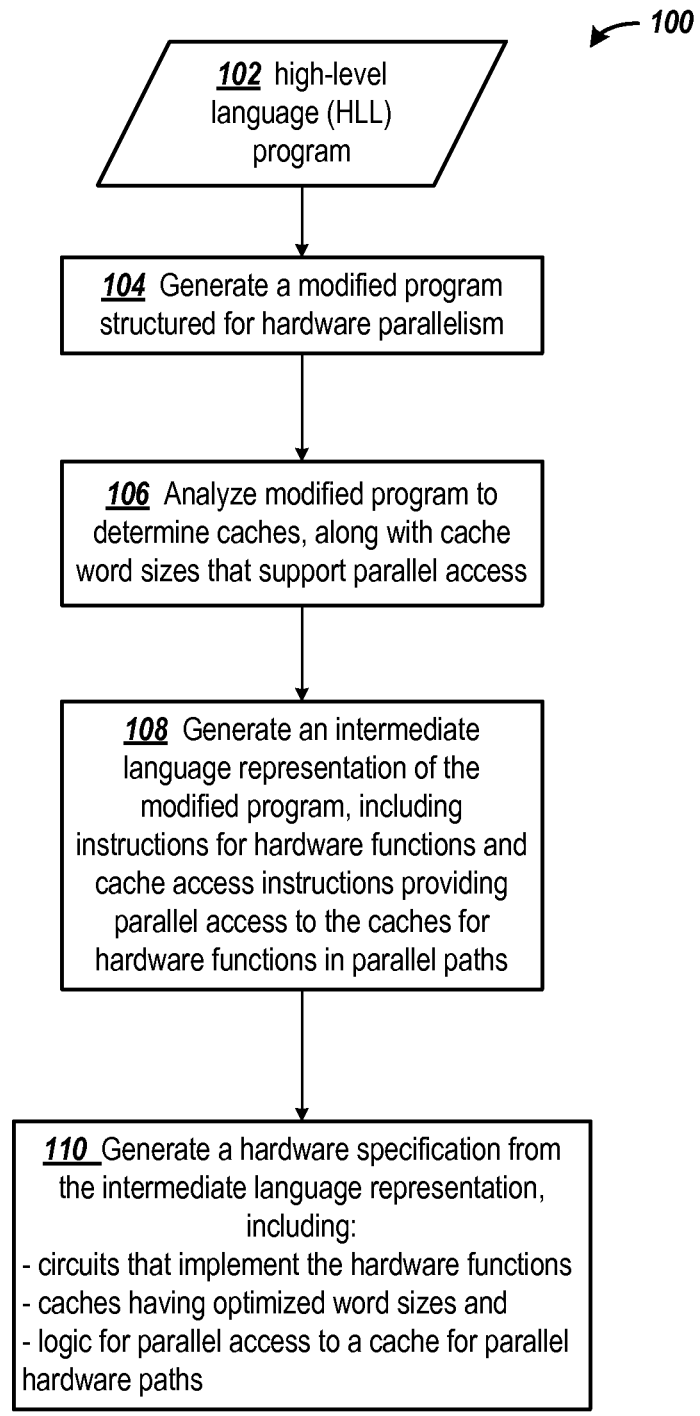
FIG. 1 is a flowchart of an example process for generating a hardware specification from an HLL program.

The present invention is applicable to a variety of programmable hardware circuits. An appreciation of the present invention is presented by way of specific examples utilizing programmable integrated circuits (ICs) such as field programmable gate arrays (FPGAs). However, the present invention is not limited by these examples, and can be applied to any appropriate hardware device that includes programmable resources capable of implementing the described functions.

It has been recognized that opportunities for parallelization of memory accesses may be determined from the HLL program. One approach to parallelizing memory access is to instantiate many caches on the PLD, with each cache associated with one or more of the hardware functions. With multiple parallel hardware functions having access to a single cache, however, congestion may occur at the cache since the cache will have a limited number of ports, and the congestion may reduce the throughput of the hardware functions.

The various embodiments of the invention generally provide a many cache architecture in which a cache word size is determined and optimized during compilation of an HLL program. The many cache architecture reduces the stalling of software functions and hardware functions which may result from data access dependencies between those functions. The optimizing of the cache word size supports parallel processing of data in the cache without increasing the need for complex arbitration logic for access to the cache.

In one embodiment, a process for determining a cache word size in order to support parallel hardware structures, without increasing the need for arbitration logic, begins in compilation of an HLL program. A compiler recognizes non-dependent accesses to two or more consecutively addressed data items, where a cache is to be established for those data items. "Accessing" refers to either reading a data item from or writing a data item to the cache. The compiler generates intermediate language code for the cache and those functions to be implemented in hardware. In generating the intermediate language code, the compiler determines and specifies a word size for the cache that covers those consecutively addressed data items. The compiler generates a single memory access instruction in the intermediate language for accessing those consecutively addressed data items in the cache. Since a single word of the cache covers the consecutively addressed data items, those multiple data items can be accessed with a single request. For example, if the word size of the cache is designated as 64 bits, two 32-bit data items may be stored in one word of the cache and accessed in a single request. Also, since the multiple data items may be serviced in a single request to the cache, there is no need to arbitrate access to the cache for those multiple data items. In addition, those data items may be processed in parallel since those data items are accessible in a single request to the cache.

A hardware specification is generated from the intermediate language program. The hardware specification specifies a cache for caching the at least two consecutively addressed data items and that provides access to the at least two consecutively addressed data items in response to a single access request. The hardware specification further specifies one or more respective hardware blocks that implement the respective function of the one or more instructions in the intermediate language program. One or more of the hardware blocks process the at least two data items in parallel.

Figure 6:
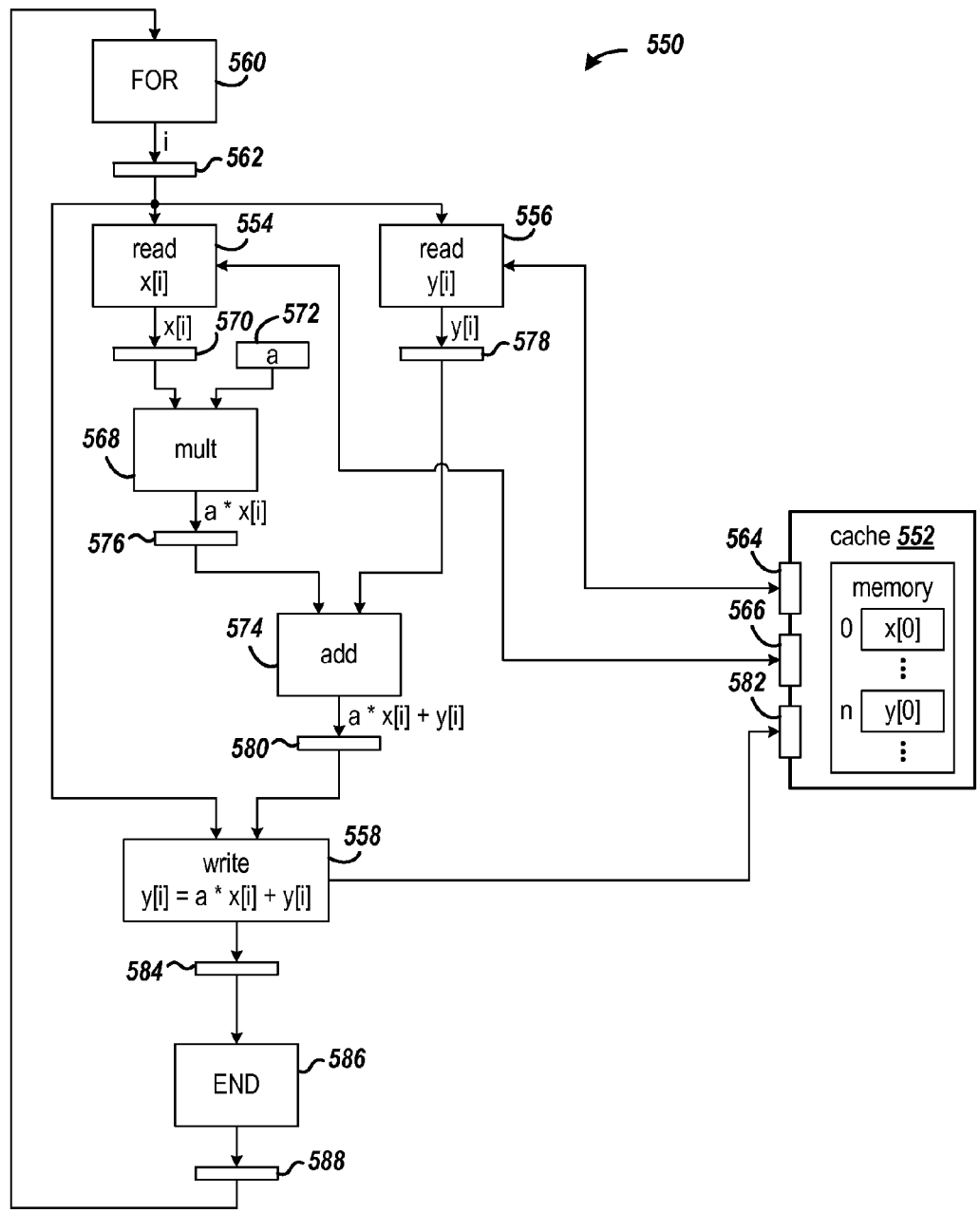
FIG. 6 is a functional block diagram of a circuit generated from the intermediate language program code shown in Example 2.
Figure 7:
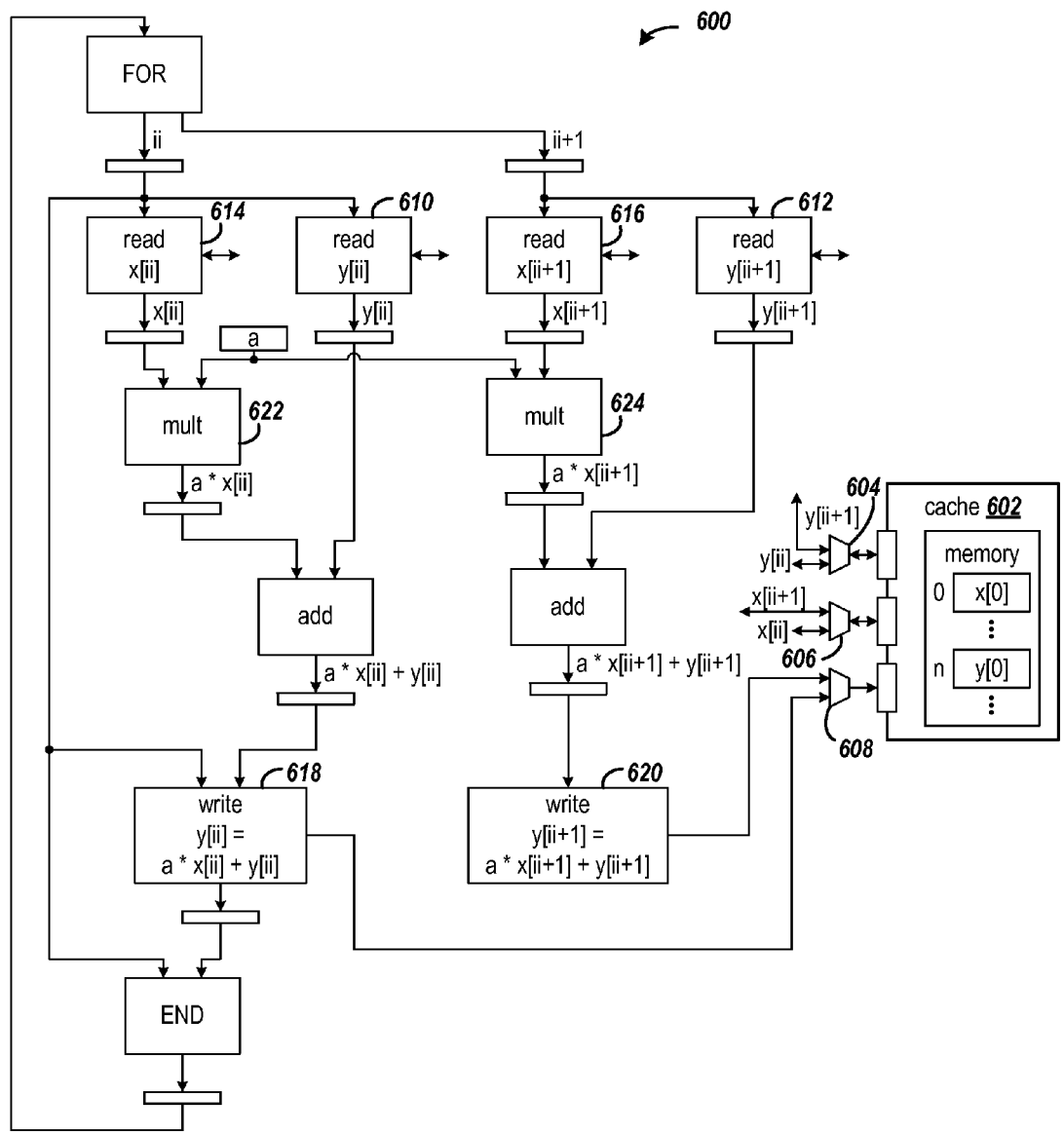
FIG. 7 is a functional block diagram of a circuit generated from the intermediate language program code of Example 4.
Figure 8:
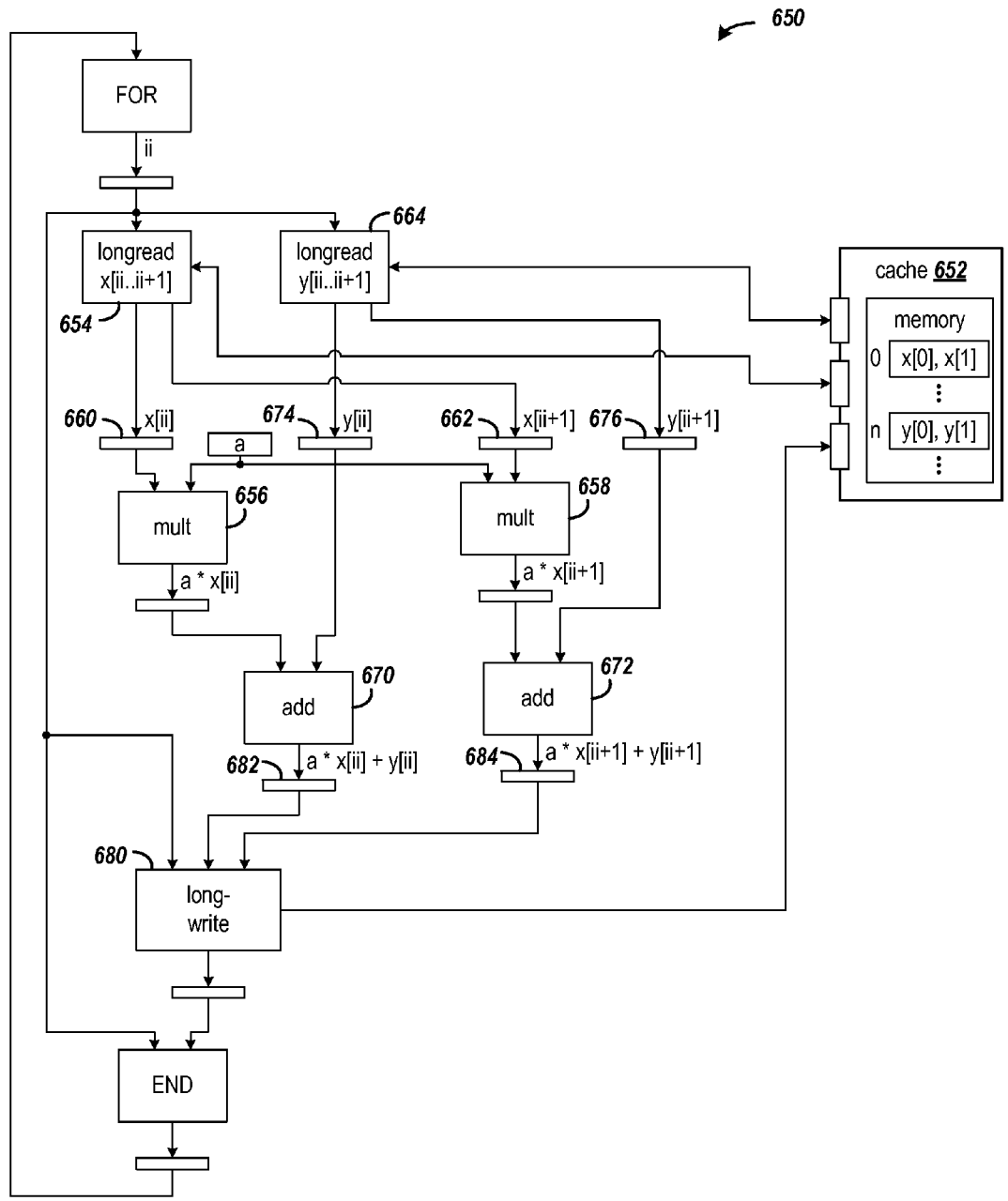
FIG. 8 is a functional block diagram of a circuit generated from the intermediate language program code of Example 4 in which the cache word size has been optimized.

FIGS. 1-5 and the accompanying description describe generation of the many cache architecture along with optimization of the word size for each cache. FIGS. 6-8 illustrate the benefits achieved in optimizing the cache word size for a cache generated from example HLL program code.

Generally, cache architecture is thought of as having local cache memory located between a microprocessor and a larger main or system memory, where the local cache memory is conventionally SRAM and the system memory is conventionally DRAM. However, as used herein, cache architecture refers to distributing local cache memory in many caches throughout a circuit in contrast to being bound to the microprocessor.

As described below in additional detail, an application written in an HLL does not have to be tailored to work with a compiler targeted at a data streaming model. Rather, a compiler that is compatible with a microprocessor memory model architecture may be used. Thus, additional work for converting an application written in a HLL to work with a compiler directed at data streaming model may be avoided, as the code does not have to be tailored to the data streaming model compiler.

In the following description, it will become apparent that an application written with HLL source code may be compiled without having to convert the source code to a data streaming model. In addition, it will become apparent that code previously written for execution by microprocessors, namely written for a microprocessor or microprocessors memory model, may be directly compiled for instantiation in an FPGA. It will be further appreciated that such an application so instantiated in an FPGA effectively may be considered more of an application-specific circuit. In other words, an application written in an HLL source code, which previously may have been targeted for a microprocessor memory model along the lines of a general purpose adaptation, is converted based on the compilation to a circuit which is tailored to the application.

FIG. 1 is a flowchart of an example process 100 for generating a hardware specification from an HLL program. The resulting hardware specification describes hardware functions derived from the HLL program, along with many caches. The caches have word sizes, which support parallel access for parallel hardware paths, as determined and optimized by compilation of the HLL program.

From an input high-level language program 102, at step 104 a modified program is generated which is structured for hardware parallelism. Such parallelism may include, for example, the unrolling of loops in the program code. With a loop having been unrolled some number of times, that number of parallel hardware paths may be generated.

At step 106, the process analyzes the modified program to determine the appropriate caches along with optimized word sizes for those caches. An optimized cache word size is that which supports parallel access for the parallel hardware paths to be implemented. For example, if non-dependent, consecutively addressed data items are to be processed on parallel hardware paths then the cache word size is selected to store those data items in one word. A particular example is an array or other structure in which consecutively addressed array elements are processed in parallel hardware paths. The cache that stores the array would have a word size sufficient to store those consecutively addressed array elements data items. For example, for an array x with elements x[i] and x[i+1] to be processed on parallel hardware paths, one word of the cache stores both x[i] and x[i+1], thereby permitting the two data elements to be accessed in a single cache access request. Where the cache access is a read, a single read request reads the single cache word with multiple data items, and that cache word is split for providing the data items to the parallel hardware paths. Similarly, where the access is a write, the data items from parallel paths are combined into one word for a write request, and those data items are written to the cache in a single write request.

At step 108 an intermediate language program is generated from the modified program. The intermediate language program includes instructions for the hardware functions, along with cache access instructions for reading data from and writing data to the caches. The type of cache access instruction used depends not only on the type of access (read or write), but also on whether or not the cache word size has been optimized for storing multiple data items. This distinction is made because for the optimized cache word size multiple data items from the cache are being provided to parallel data paths in the case of a read, or multiple data items from parallel paths are being combined into a single word for writing to the cache. Where the cache word size not optimized, a word read from the cache is not necessarily split into separate data items for parallel data paths. Similarly, for writing a word the data in that word need not be combined from parallel paths.

A hardware specification is generated from the intermediate language program at step 110. The approaches described in the Bennett patent may be used to generate the hardware description for the hardware functions, and the description below may be used in generating the hardware description of the caches. In an example embodiment, the hardware specification is in a hardware description language (HDL).

The generated hardware description specifies the circuits for implementing the hardware functions, along with the caches with optimized word sizes. The hardware description also specifies the logic for accessing the caches with optimized word sizes. As described above, for read access the logic splits a word read from the cache into multiple data items to be processed in parallel hardware paths. For write access, the logic combines data items from parallel hardware paths into a single word for writing to the cache.

Figure 2:
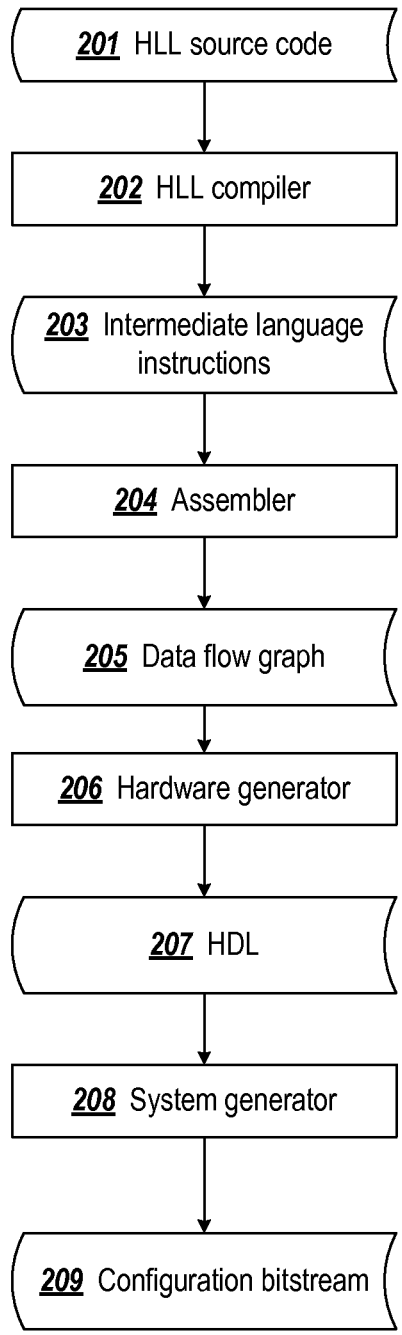
FIG. 2 is a block/flow diagram depicting an example embodiment of a compilation flow.

FIG. 2 is a block/flow diagram depicting an example embodiment of a compilation flow 200. Compilation flow 200 starts with source code written in an HLL at 201. At 202, the HLL source code is compiled by an HLL compiler. The HLL compiler is not directed at a data streaming model, as described below herein in additional detail, but is directed at a spatial compilation. By spatial compilation, it is generally meant generation of application directed systems where data and control are stored near their uses for transmission over small distances. Thus, HLL source code, which may have previously been written for a general purpose microprocessor memory model or a spatial association of compute elements, may be used.

For a spatial compilation, compute elements are unrolled for the hardware, where such compute elements operate on data present on their inputs. This increases parallel or concurrent operation, such as may be implemented in a pipelined architecture. In such a pipelined architecture, computational elements may operate at lower frequencies though with multiple computations executed in parallel on data sets within a same clock cycle. Additionally, data dependency status for data involved in compute element operations is determined to identify compute operations having no data dependency. Thus, data associated with such compute operation having no data dependency may be stored in a local cache with respect to a compute element or compute elements performing the compute operation. The ability to locally cache data allows such data locality to be exploited. By facilitating multiple instructions being executed in parallel with data locality, memory bottlenecks, namely where memory throughput is lower than data consumption rate of an accelerator circuit, may be avoided. By locally cacheable data, it is not meant all data. For example, in the computer language C, locally cacheable data types include array data types, pointer data types, structure data types, and global data types. While the embodiments described herein are not limited to these data types in C, it should be understood that not all data is locally cacheable data as described herein. Thus, conventionally temporary scalar data stored in a register file in a microprocessor is not locally cacheable data. Moreover, conventionally data which is stored in "main memory" is locally cacheable data.

It shall be appreciated that memory accesses are random memory accesses in contrast to data streaming accesses. However, instructions compiled by an HLL compiler may be those of a traditional microprocessor Instruction Set Architecture ("ISA") for microprocessor chip set. In addition to such instructions, performance may be enhanced by additional tailoring due to the availability of programmable logic not available with a general purpose microprocessor.

Caches facilitate exploitation of data locality. FPGAs, which conventionally have BRAMs or may be configured with look-up table random access memories ("LUTRAMs"), may be used as described below in additional detail to implement a distributed cache. The distributed cache may be used to provide data locality with respect to computational circuits of an application or design. Heretofore, distributed caching was not advocated for implementation in an FPGA, as it undermined the more performance driven data streaming model. However, ease of use may be facilitated by a distributed cache, as the more well-known software programming model for writing source code for microprocessors may be used.

In a conventional software application, memory accesses actually are not random, but may be correlated. Thus, locality of memory accesses, spatial locality, and temporal locality may be associated with such correlation. Spatial locality conventionally means that data for an operation is accessed and there is likelihood that neighboring data will also be accessed for the same operation. Temporal locality conventionally means that data which has recently been accessed is likely to be accessed again within the near future. A distributed cache may take advantage of spatial locality by having sets of data immediately available to a compute operation for which they are used, and by caching such data, temporal locality may be facilitated. Caches as used in microprocessor architecture are well known. It should be appreciated that such caches are fixed general purpose caches which are not tailored to a specific application to be executed on the general purpose microprocessor.

Patterns of memory accesses may be unchanged by an implementation of an accelerator in an FPGA as described herein even though the same software which may have previously been used for execution in a microprocessor memory model, is executed in an FPGA instantiation of the application. However, by having a distributed cache, data locality may be enhanced along with overall system performance. In fact, multiple memory accesses may be supported in parallel, unlike a conventional microprocessor system. Furthermore, unlike a conventional multi-microprocessor system with shared memory, multiple memory accesses may be facilitated with less arbitration.

As described herein in additional detail, an HLL compiler is configured to create multiple caches which may be specific to an application being compiled. These multiple caches may support multiple memory accesses, which may be concurrent. Furthermore, such caches may be parameterized to be more tailored to the application being compiled.

An HLL compiler that may be adapted for providing a distributed cache is Compiling High Level Language to Massively Pipelined System ("CHiMPS"). An intermediate language file is the output language of an HLL compiler. Compilation flow 200 is for CHiMPS that has been adapted to provide a distributed cache. Thus, in flow 200, HLL source code is compiled into the intermediate language and then data flow architecture is generated from the intermediate language. In contrast to non-adapted CHiMPS, the data flow architecture of adapted CHiMPS uses a distributed cache in addition to first-in/first-out buffers ("FIFOs"). Thus, in contrast to what was previously done in a non-adapted CHiMPS, the pipelines having read and write instructions, any number of which may be operated in parallel depending on data dependency constraints in an application, are partitioned into read and write instructions between multiple caches. All or some of these multiple caches may be coherent depending upon the data uses of the application. Thus, reads and writes may be allocated to different caches to facilitate data locality, as well as execution in parallel. Of course, reads and writes associated with a same cache may be serviced in sequence using an arbitration protocol. Additional detail regarding a non-adapted CHiMPS compiler may be found in the Bennett patent.

HLL compiler 202, which in this example is an adapted CHiMPS as described above, compiles HLL source code 201 to provide intermediate language instructions 203. Intermediate language instructions 203 are provided as input to assembler 204. Responsive to intermediate language instructions 203, assembler 204 provides a data flow graph 205. Data flow graph 205 may be input to a hardware generator 206 for generating a hardware description language code (HDL) 207. HDL 207 may be input to a system generator 208 to provide a configuration bitstream 209.

HLL compiler 202 may be configured to assign all memory operations to a single cache, or alternatively allow a programmer to assign different caches by modifying cache identification (ID) values generated by HLL compiler 202. A restrict keyword in the C programming language for example may be used by a programmer to qualify an array such that HLL compiler 202 is informed that such an array or a memory location thereof is non-aliased. HLL compiler 202 may, though need not, be configured to support restrict operations. However, if restrict operations are supported, HLL compiler 202 may generate different cache IDs in the presence of multiple arrays. This may be done by modifying an intermediate language file generated by HLL compiler 202 to identify arrays for separate caches. Alternatively, rather than modifying an intermediate language file, a separate file may be used to identify arrays for separate caches.

Intermediate language instructions 203 facilitate creation of multiple caches as part of compilation flow 200. An example format for a read instruction may be:

read <cacheid>;[<tapid>];[<width>];<address>;[<sync-in>];<data>[;sync-out>]

This read instruction is presented as a pseudo-instruction for coupling a FIFO (not shown) for an address register identified in such instruction to a read tap address input. The FIFO for the data register identified in the read instruction is coupled to a tap output register. Responsive to a FIFO receiving a value for an associated address, such value may be automatically directed to a read tap to initiate processing. However, this does not necessarily mean that the data FIFO will be ready when a next instruction calls for data. Thus, it is possible that the consumer of such data will be blocked waiting for a read to finish. The read instruction described above is for a cache for which the word size has not been optimized. A "longread" instruction is provided for reading from a cache with an optimized word size as described further below.

HLL compiler 202 may assign a cache ID value for a read instruction, as well as a tap ID value. The cache ID value identifies to which cache the read is directed. Of note, HLL compiler 202 may be configured to make informed decisions based on input source code, namely to identify which instructions are more likely to access memory, and in particular which instructions are more likely to access the same cache. Alternatively, rather than relying on HLL compiler 202, a programmer may embed such information for HLL compiler 202 to indicate which instructions are more likely to access the same cache.

A tap identifier in a read instruction is a number from 0 to (N−1), where N indicates a number of available taps in a multi-ported memory. There may be a multiple of read ports, a multiple of write ports, or a combination of multiples of read and write ports. A tap identifier indicates which tap for a cache memory is to be used. As used herein, a cache may be assumed to be implemented using random access memory resources of a PLD. A cache controller may read data for a lowest tap number first, such that HLL compiler 202 may assign numbers in reverse order in intermediate language instructions 203.

Sync-in and sync-out in a read instruction facilitate execution of reads and writes within a specified pipeline or thread in a proper order. If there are no data dependencies between reads and writes, a particular read and write may, though need not, occur in the same order in which they are specified in intermediate language instructions 203. This is because order is dependency-based, which allows for operations that are not interdependent, namely operations that do not have data dependencies upon one another, to be executed concurrently. As described herein, separate memories or non-overlapping memory spaces in multi-ported memories are assigned to each read or write, or at least a portion of either the reads or writes, or both, in the intermediate language instructions. Thus, for example, a read instruction having no data dependency and being associated with only locally cacheable data may be assigned a RAM in a programmable logic device, which is not shared. Furthermore, for example, a read instruction having no data dependency and being associated with only locally cacheable data may be assigned a separate memory space in a multi-ported RAM in a programmable logic device, which is shared though the sharing does not preclude concurrent reads therefrom. Assembler 204 may be unable to track external memory dependencies; accordingly, sync registers (not shown) used for sync-in and sync-out may be used for tracking such dependencies with respect to external memory.

Actual values in sync-in and sync-out registers need not actually be used. Rather the presence of data in FIFOs may provide synchronization. Of note, such FIFOs may be "zero-bit-wide" FIFOs if there is hardware to support such a configuration. A read instruction may be paused until data is in a sync-in FIFO before actually executing a read from such FIFO. Once data in a sync-in FIFO is available, data may be entered into a sync-out FIFO, which may be simultaneous with entry of data into a data FIFO.

In an example format of a write instruction, the following fields may be included:
write <cacheid>;<address>;<write value>;<word width>; [;[<sync-in>][;sync-out>]]

A write command causes a value to be written into a memory controller at an identified location in memory. The cache ID value identifies to which cache the read is directed. The address field in a write instruction is an operand which identifies a physical address for the start of data to be written into memory. The word width field identifies how many bytes of data are to be written starting at such starting address. The write value field is for an operand. If bit width of the memory is different from the value in the word width field, the write value may be used for padding or truncating the data in order to fit the bit width of the physical memory data interface for such a write. The write instruction described above is for a cache for which the word size has not been optimized. A "longwrite" instruction is provided for writing to a cache with an optimized word size as described further below.

Sync-in and sync-out registers, which may be implemented as FIFOs (not shown), may be used to synchronize memory accesses. Actual values in such sync-in and sync-out FIFOs need not be used; rather, the presence of data in such FIFOs may be used for synchronization. A write instruction may be paused until there is data in a sync-in FIFO before initiating execution of a write. Once a write command has been executed, at least with respect to one or more local caches, data may be transferred to a sync-out FIFO. Of note, the read instruction and the write instruction may be indicated as a "memread" instruction and a "memwrite" instruction, respectively.

Multiple loop iterations may be executed at the same time and sync-in and sync-out may be used to ensure that the reads and writes within an iteration happen in an intended order. If a cache ID is specified in a read or write instruction, such cache ID identifies to which cache a read or write is to be directed. If a write instruction specifies multiple cache IDs, namely multiple locations to which data is to be written, then those identified caches may be updated with the written memory. Additionally, external memory may be updated for data coherency. If no cache ID is specified, all caches may be notified of a write to external memory for purposes of erasing or deleting associated information in those caches, namely deleting data in one or more lines of those caches. In other words, if no caches are specified, the write may go directly to off-chip memory. Of note, this may be used to force cache lines, which are otherwise flagged for being presently in use, to be written from such caches to external memory before sync-out is issued or otherwise asserted.

Figure 3A:
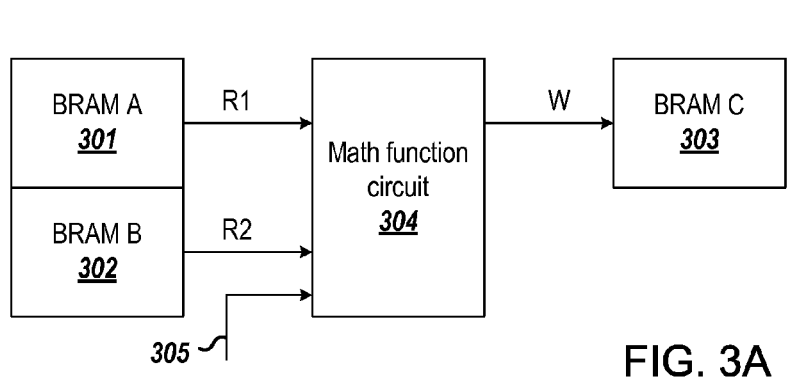
FIG. 3A is a block diagram depicting an example embodiment of a circuit which may be implemented responsive to output of an HLL compiler.

FIG. 3A is a block diagram depicting an example embodiment of a circuit 310 which may be implemented responsive to output of HLL compiler 202 of FIG. 2. Compiler 202 may identify read instructions R1 and R2 and a write W instruction in a line of source code. HLL compiler 202 may thus assign BRAM 301 and BRAM 302 for storage of data A associated with read instruction R1 and for data B associated with read instruction R2, respectively.

A math function circuit 304, which may be implemented in programmable logic, may receive a command signal 305 for carrying out a mathematical operation on data read responsive to read instructions R1 and R2 having addresses for BRAMs 301 and 302, respectively. Of note, even though BRAMs are used, as such BRAMs are generally available in an FPGA, other forms of random access memory may be used. Furthermore, for an FPGA implementation, LUTRAMs may be used. After performing each operation on data obtained responsive to read instructions R1 and R2, math function circuit 304 may issue a write instruction W for writing result data C from math function circuit 304 to BRAM 303 starting at an address specified by W.

Of note, it is not necessary that each read instruction and each write instruction be associated with a separate memory, such as BRAMs 301 through 303, for purposes of data locality.

Figure 3B:
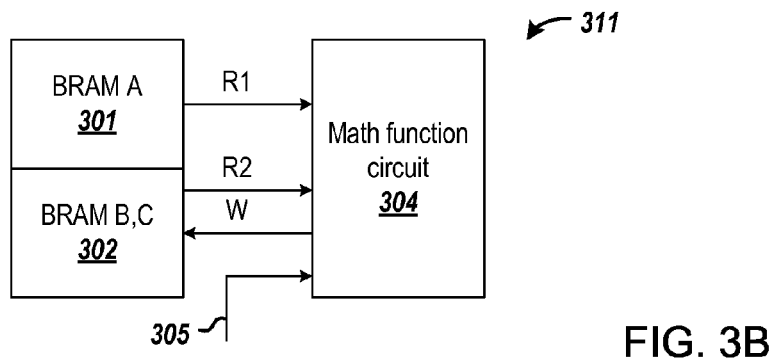
FIG. 3B is a block diagram depicting an example embodiment of a circuit which may be implemented in an FPGA responsive to output from an HLL compiler.

FIG. 3B is a block diagram depicting an example embodiment of a circuit 311 which may be implemented in an FPGA responsive to output from HLL compiler 202. In this circuit, reads R1 and R2 are still assigned to BRAMs 301 and 302, however, write instruction W is assigned to BRAM 302 for writing result data C thereto.

Figure 3C:
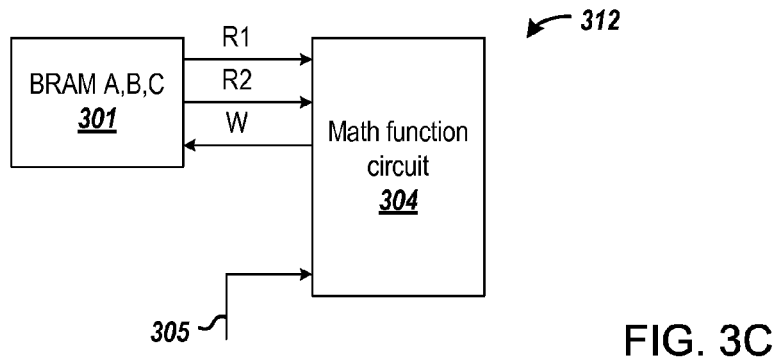
FIG. 3C is a block diagram depicting another example embodiment of a circuit which may be implemented in an FPGA responsive to output from an HLL compiler.

FIG. 3C is a block diagram depicting an example embodiment of a circuit 312 which may be implemented in an FPGA responsive to output from HLL compiler 202. In FIG. 3C, read instructions R1 and R2, as well as write instruction W, are assigned to BRAM 301. Of note, for executing reads in this example in parallel, BRAM 301 may be a multi-ported BRAM. Alternatively, if multi-porting is not available, multiplexing circuitry may be provided on the input or output end, or both, of a memory for providing multi-port capability.

Figure 4:
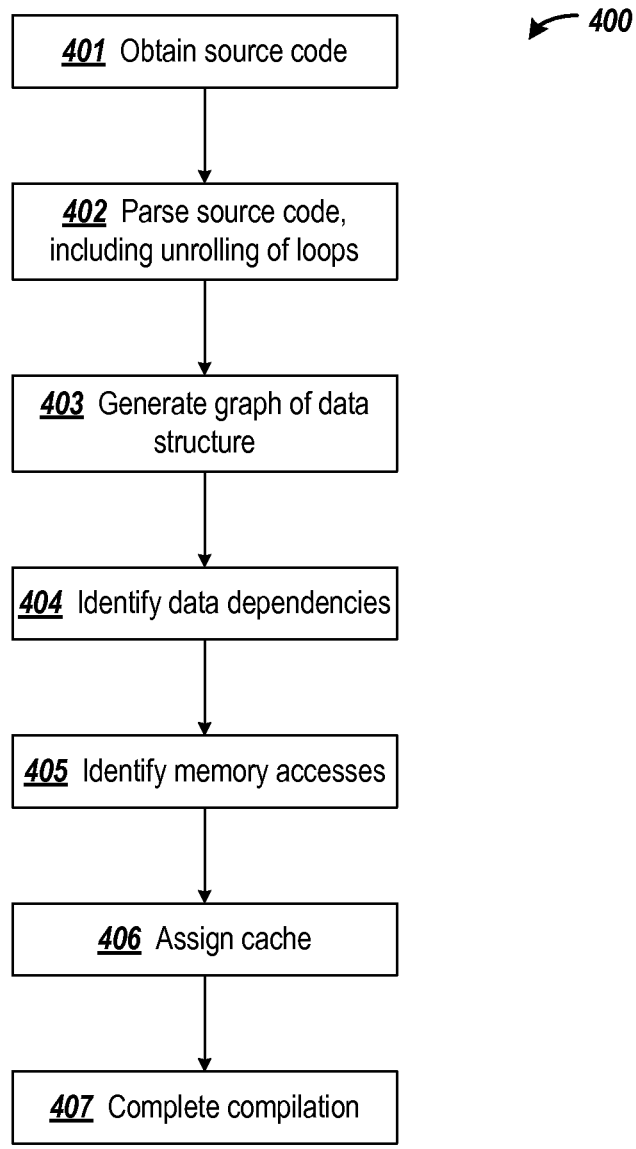
FIG. 4 is a flow diagram depicting an example embodiment of an application-specific partitioning of memory access to multiple caches flow.

FIG. 4 is a flow diagram depicting an example embodiment of an application-specific partitioning of memory access to multiple caches flow 400. Flow 400 may be part of HLL compiler 202, which produces the intermediate language code.

At 401, source code for an application is obtained. Source code may include one or more one or more lines of instructions which may after compilation be read or write instructions. It should be understood that source code may not actually call out a read or a write to memory until after such source code is compiled or assembled. At step 402, the source code is parsed and analyzed for optimization opportunities for structuring hardware and structuring the cache. For example, the HLL source code is optimized for hardware parallelism by unrolling selected program loops some number of times. For purposes of optimizing the cache structure, accesses to consecutive non-dependent logical addresses are identified for determining the cache word size as will be explained further below. At 403, a data flow graph is generated from source code parsed at 402. At 404, data dependencies are identified from the data flow graph.

At 405, memory accesses in the source code obtained at 401 are identified. These may include one or more memory read accesses, one or more memory write accesses, or a combination thereof. If a read or a write memory access in HLL source code 201 is associated with processing data having dependencies, then at 406 such memory access is not assigned a separate cache or a separate memory space of a multi-ported cache of a distributed cache as described herein. Thus, for example, all such reads and writes with data dependencies may be excluded from being assigned separate cache at 406.

If, however, all the data of a read or a write memory access in HLL source code 201 is independent, namely no data dependency, then at 406 those memory accesses without data dependencies may be assigned to individual caches or may share one or more caches with non-overlapping memory spaces at 406. Of note, the data described as being cacheable in a separate cache or a separate memory space of a multi-ported cache is locally cacheable data. Furthermore, such locally cacheable data without data dependency is assigned a separate/non-shared cache, or assigned a non-overlapping/separate memory space in a shared multi-ported cache for concurrent access. After memory accesses are assigned to caches at 406, at 407 HLL compiler 202 may complete the compilation of HLL source code 201 including assigning memory accesses to multiple caches responsive at least in part to the identified memory accesses having no data dependencies.

For application-specific partitioning of memory accesses to multiple caches for a design or application to be instantiated in an FPGA, cache may be assigned to each read and each write instruction provided there are no data dependencies associated therewith. In other words, for one or more read instructions without data dependencies cache may be allocated, and for each write instruction without data dependencies cache may be allocated. To maximize parallelism, independent memory accesses may be assigned to different caches. Allocation of such caches may be done by HLL compiler 202. Furthermore, allocation of such caches may be done in conjunction with use of HLL compiler 202 under guidance of a software programmer. For example, in embedded C code, a programmer may guide a compiler, such as HLL compiler 202, to allocate separate memory spaces for each array by explicitly specifying such allocations. Moreover, because such explicit specification may be done, a programmer may manually encode in HLL source code, such as HLL source code 201 of FIG. 2, the assignment of caches.

In order to further understand the assignment of caches, an example of vector addition is provided for purposes of clarity. The example of vector addition is provided for vectors A and B being added to provide a vector C for data 0 through 63, where i is incremented by 1, as indicated below:

for (i=0; i<64; i++) C[i]=A[i]+B[i];

In this code, a vector sum of A and B is calculated and the result C is stored. In this example, the reads from A and B originate from the same cache. Furthermore, the write of C is to the same cache from which A and B were previously read, as generally indicated in FIG. 3C.

A refinement would be to allocate three memory access instructions to different caches as arrays associated with vectors A and B, and resulting vector C are independent. Of note, it is assumed that the data associated with vectors A and B have no data dependencies. Accordingly, if data associated with vectors A and B are not data dependent, then resultant vector C in this example is likewise not data dependent. By assigning three separate caches, such as generally indicated in FIG. 3A, conflict between the three arrays associated with vectors A and B and vector sum C may be eliminated in comparison to obtaining all data for example one from a single cache and storing a result in such cache. By assigning three separate cache memories for data for vectors A, B, and C, respectively, parallelism of cache access is enhanced.

The following example is the same as the above example except it indicates the assignment of three separate cache memories as opposed to a same cache memory as in the prior example:

for (i=0; i<64; i++) {
C[i]=A[i]+B[i];
}

An intermediate language instruction set for the above example for assigning separate memory accesses to independent caches may be as follows:

read 0; 0; 4; A_addr; sync_in; sync_out
read 1; 0; 4; B_addr; sync_in; sync_out
write cache_id; C_addr; C_value; 4;sync_in; sync_out Furthermore, an intermediate language instruction set for assigning memory accesses all to a single cache as in the first example may be as follows:

read 1; 1; 4; A_addr; sync_in; sync_out
read 1; 2; 4; B_addr; sync_in; sync_out
write cache_id; C_addr; C_value; 4; sync_in; sync_out Accordingly, with renewed reference to compilation flow 200 of FIG. 2, it should be appreciated that from HLL source code 201 to configuration bitstream 209, a single cache or multiple caches with complete independence or any combination therebetween, may be used for providing an application-specific partitioning of memory accesses for an application or design to be instantiated in an FPGA or an ASIC.

Of note, it is possible that data is shared between operations. Accordingly, there may be some coherency of data to be addressed as between caches. Such data coherency may be used to preserve for example coherency between caches, as well as between caches and main or system memory. For coherency, data may be broadcast to all caches and main memory. It should be understood that busing may be provided as part of a configuration bitstream 209 for purposes of data coherency among caches or among caches and main or system memory, or some combination thereof. However, data coherency will vary from application to application.

Figure 5:
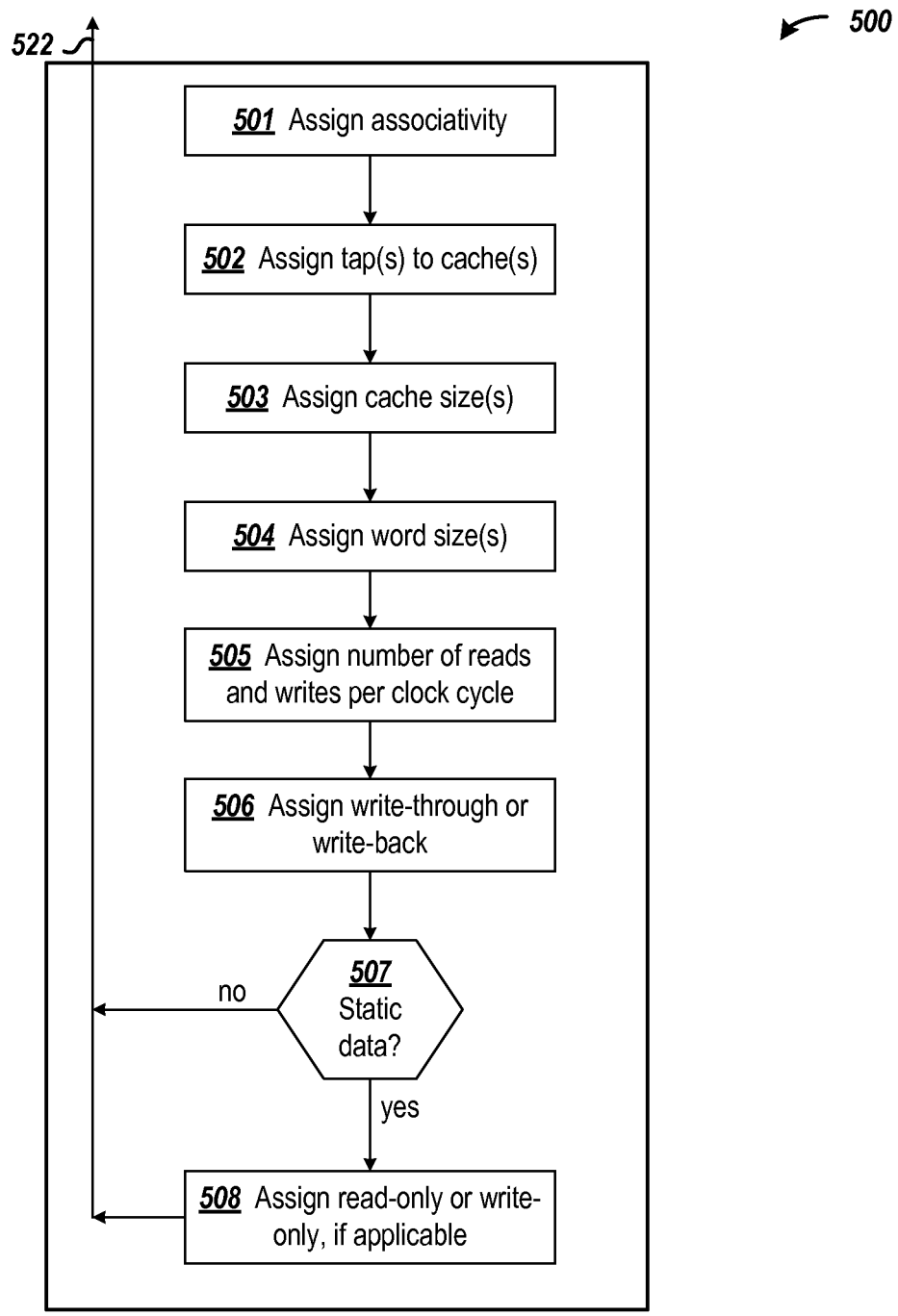
FIG. 5 is a flow diagram depicting an example embodiment of a cache assignment flow.

FIG. 5 is a flow diagram depicting an example embodiment of a cache assignment flow 500. Each of the operations of cache assignment flow 500 are illustratively shown with dashed lines to generally indicate such operations are programmable options for tailoring to an application.

Cache assignment flow 500 may be implemented in whole or in part for assigning caches as described above with reference to step 406 of flow 400 of FIG. 4. Cache assignment flow 500 facilitates a parameterized cache which may be tailored to a specific application, namely an application or design provided via HLL source code 201 that is to be compiled by HLL compiler 202 of FIG. 2. At 501, associativity of a cache or caches may be assigned. Associativity may include directly mapped caches, two-way associative caches, four-way associative caches, or other associativity. Again, like many other variables, associativity may vary from application to application.

At 502, one or more taps may be assigned to one or more caches. As previously mentioned, cache memory may be multi-ported, and thus read taps and write taps may be assigned. At 503, cache size may be assigned. Of note, the size of a cache may vary depending on the amount of data to be cached. In addition, the cache word size is selected according to accesses specified in the HLL program code. For a cache in which the HLL program code does not show accesses to non-dependent, consecutively addressed data items in the cache, the cache word size is set for storing a single data item. In contrast, for a cache in which the HLL program shows accesses to non-dependent, consecutively addressed data items in the cache, the cache word size is set to store multiple ones of those data items. For example, for a cache to be established for an array, A, specified in the HLL, where there are accesses in the HLL to A[i] and A[i+1] (with no intervening updates to these locations), then the word size for the cache is selected to encompass both of A[i] and A[i+1]. With respect to BRAMs in an FPGA, such BRAMs may be concatenated to form larger memory spaces. However, for an ASIC, cache size may be assigned to accommodate specific data needs of an application.

Where the cache word size of a cache is optimized such that one cache word stores multiple data items, instead of the read and write intermediate language instructions described above in association with FIG. 2 for accessing the cache, special cache access instructions of the intermediate language are used. These instructions are named longread and long write. The format of the longread instruction is as follows:
longread <cacheid>; <width_per_word>;<number of items>;<address>; [<sync-in>];<data>;[<sync-out>]

The <cacheid>, <address>, [<sync-in >], <data>, and [<sync-out>] fields are as described above for the read instruction. The <width_per_word> field specifies the number of bytes in a cache word in an example embodiment, and the <number of items> field specifies the number of data items in a word of the cache.

The format of the longwrite instruction is as follows:
longwrite[<cacheid>]; <width_per_word>;<number of items>;<address>; [<sync-in >];<data>[;syncout>]
The <cacheid>, <address>, [<sync-in >], <data>, and [<sync-out>] fields are as described above for the write instruction. The <width_per_word> field specifies the number of bytes in a cache word in an example embodiment, and the <number of items> field specifies the number of data items in a word of the cache.

At 504, one or more cache line sizes may be assigned. Cache line sizes may vary according to the number of words read out or written in during a burst. Furthermore, this will vary depending on the size, namely number of bits, of a word. Conventionally, burst length is set equal to line length. With respect to BRAMs in an FPGA, such BRAMs may be concatenated to form longer lines.

At 505, the number of reads or writes, or both, per clock cycle may be assigned. It should be appreciated that data may be segmented such that multiple reads or multiple writes, or both, occur in a single clock.

At 506, whether cache memory is to be used in a write-through or write-back mode may be set. At 507, it may be determined whether data associated with such cache is static data. An example of static data includes a fixed set of data completely contained within cache. Another example of static data includes a fixed set of data from which portions are moved from memory into and out of cache. In the latter example, data in cache may be changing; however, the set of data available to such cache for an application is static. If data is not static, then no assignment of any read only status is made, and cache assignment flow 500 is exited.

If, however, data is static for operation of a design instantiated, then at 508 caches may be set to be read-only cache or write-only cache, as applicable. Continuing the above example, if the array of data associated with vector B is static, HLL compiler 202 may be used to instantiate a read-only cache for storing data associated with vector B. Accordingly, all logic and circuitry associated with supporting writes to such a cache may be removed. Likewise, if a cache is to be used as a write-only cache, circuitry associated with supporting reads from such cache may be removed.

Thus, output 522 of cache assignment flow 500 may include any of a variety of parameters associated with operations 501 through 506 and 508. Of note, not all operations 501 through 506 and 508 need be used. Furthermore, none of operations 501 through 506 and 508 need be used, as default values may be used. However, to provide a parameterized cache which more closely follows a specific application being compiled, cache assignment flow 500 may be used.

Thus, it should be appreciated that the above-described memory model of a distributed cache may be used to exploit data locality. Furthermore, the number of caches generated for such a distributed cache is not necessarily limited by the application, but rather may be limited by the number of embedded memories available with respect to implementation in an FPGA, and need not necessarily be limited with respect to an ASIC implementation.

The program code in Examples 1-4 and the schematics of FIGS. 6-8 show the optimization achieved for a cache structure for an example fragment of an HLL program. The example shows a progression from a hardware structure based on a program loop that has not been unrolled, to a hardware structure based on the program loop having been unrolled but without optimizing the cache word size, and to a hardware structure based on the program loop having been unrolled and having optimized the cache word size.

While the example illustrates an instance in which the identified consecutive memory accesses are associated with an unrolled program loop, it will be appreciated that other instances of accesses to consecutive memory addresses may be suitable for optimizing a cache word size and cache accesses. For example, a 64-bit cache word may store two single precision or two integers. In another example, a cache may be established for a particular program structure, such as a C language structure. Where multiple consecutive fields of that structure are accessed, the cache word size may be established to accommodate a single access to those multiple fields.

The program code in Example 1 below is a partial HLL program that illustrates example HLL code from which an optimized cache structure may be generated in accordance with various embodiments of the invention. The HLL program code carries out the function described by the equation y=a*x+y where x and y are vectors/arrays and "a" variable is a scalar.

```
#define CACHE_ID_X 0
#define CACHE_ID_Y 0
void iaxpy(int n, short a, short *x, short *y) {
int i;
chimps_restrict(x, CACHE_ID_X);
chimps_restrict(y, CACHE_ID_Y);
for(i=0; i<n; i++) {
   y[i]=a*x[i]+y[i];
}
}
```

Example 1

From the HLL code in Example 1, a single cache with an ID 0 is created with one bank. The example assumes that bank is capable of performing three operations per cycle. The corresponding code generated by the compiler in the intermediate language is shown in Example 2. The code in Example 2 has not been optimized for hardware parallelism or for cache word size.

```
Enter iaxpy; n,a:16,x,y, _mem_sync:1u
   Reg _mem_sync_x_0:1u
   Add _mem_sync:1u;_mem_sync_x_0:1u
   Reg _mem_sync_y_0:1u
   Add _mem_sync:1u;_mem_sync_y_0:1u
   Reg _mem_sync_x_1:1u
   Reg _mem_sync_y_1:1u
   reg i
   reg temp0, temp1
   add 0;temp0
   add 0;temp1
   reg temp8:1
   nfor 10;n;i
      reg temp2, temp3, temp4:16, temp5, temp6:16, temp7
      add i<<1, y;temp2
      add i<<1, x;temp3
      read 0;2; temp3; _mem_sync_x_0:1u; temp4; _
         mem_sync_x_1:1u // x[(i << 1)]
      multiply a,temp4;temp5
      read 0;2; temp2; _mem_sync_y_0:1u; temp6;
         _ mem_sync_y_1:1u // y[(i << 1)]
      add temp5,temp6;temp7
      write 0;2;temp2; _mem_sync_y_1:1u;temp7;
         _ mem_sync_y_0:1u // y[(i << 1)]
```

-continued

```
      nowait _mem_sync_x_0:1u // no write
      nowait _mem_sync_y_0:1u // restrict
      nowait _mem_sync_y_1:1u // restrict
   end 10
      Or _mem_sync_x_1:1u, _mem_sync_y_0:1u;_mem_sync:1u
   Exit iaxpy; _mem_sync:1u
```

Example 2

The read and write instructions in Example 2 specify a total of three memory accesses, one for reading the x variable and two for reading from and writing to the y array. From the intermediate language code of Example 2, a hardware specification may be generated. For ease of illustration, the resulting hardware is shown as a dataflow schematic in FIG. 6.

FIG. 6 is a functional block diagram of a circuit 550 generated from the intermediate language program code shown in Example 2. The example cache 552 includes three ports for servicing the read blocks 554 and 556 and write block 558, respectively. The bi-directional line from the read blocks 554 and 556 to the cache signify the address provided to the cache and the data returned from the cache. The uni-directional line from the write block to the cache signifies the address and data provided to the cache. Elements 0 . . . n–1 of array and elements 0 . . . n–1 of array y are stored in respective words in the memory of the cache 552.

FOR block 560 provides the value i to the read blocks 554 and 556 and to the write block 558 by way of FIFO buffer 562 for addressing the arrays x and y. The read blocks 554 and 556 read x[i] and y[i] in parallel from the cache 552 via the dedicated read ports 564 and 566. The read block 554 provides x[i] to multiplier block 568 via FIFO buffer 570. The value is provided by register 572. The multiplier block provides the product of (a*x[i]) to the adder block 574 via FIFO buffer 576. When both the product from the multiplier block is available in FIFO buffer 576 and y[i] is available in FIFO buffer 578, the adder block adds the input values and provides the output sum to write block 558 via FIFO buffer 580. The write block writes the result to the cache via dedicated port 582 and signals the END block 584 via FIFO buffer 586 upon completion of the write. The END block limits circuit 550 to n iterations by way of signaling the FOR block via FIFO buffer 588.

The circuit 550 pipelines the operations specified by the HLL program code. However, circuit 550 may be improved by unrolling the HLL program loop and establishing parallel hardware structures from the unrolled loop. However, unrolling the loop without optimizing the cache word size may leave a processing bottleneck at the cache and reduce the circuit throughput. The program code in Example 3 below shows the loop from the HLL program code of Example 1 having been unrolled twice.

```
#define CACHE_ID_X 0
#define CACHE_ID_Y 0
void iaxpy(int n, short a, short *x, short *y) {
int i;
int nn;
int ii;
chimps_restrict(x, CACHE_ID_X);
chimps_restrict(y, CACHE_ID_Y);
nn=n>>1;
for (i=0;i<nn; i++) {
   short *yy, *xx;
   chimps_restrict(yy, CACHE_ID_Y);
   chimps_restrict(xx, CACHE_ID_X);
```

```
YY=Y;
xx=x;
ii=i<<1;
y[ii]=a*x[ii]+y[ii];
yy[ii+1]=a*xx[ii+1]+yy[ii+1];
    }
  }
}
```

Example 3

The variable ii has been introduced as the index into the arrays in order to preserve the value of the loop counter while allowing the parallel accesses to the arrays based on the loop counter.

The program code in Example 4 below is the intermediate language code generated from the code of Example 3 where the loop in the HLL program has been unrolled. The intermediate language code reflects the loop having been unrolled twice, but the cache word size has not been optimized.

```
Enter iaxpy; n,a:16,x,y, _mem_sync:1u
  Reg _mem_sync_x_0:1u
  Add _mem_sync:1u;_mem_sync_x_0:1u
  Reg _mem_sync_y_0:1u
  Add _mem_sync:1u;_mem_sync_y_0:1u
  Reg _mem_sync_yy_0:1u
  Add _mem_sync:1u;_mem_sync_yy_0:1u
  Reg _mem_sync_xx_0:1u
  Add _mem_sync:1u;_mem_sync_xx_0:1u
  Reg _mem_sync_x_1:1u
  Reg _mem_sync_y_1:1u
  Reg _mem_sync_yy_1:1u
  Reg _mem_sync_xx_1:1u
  reg i, nn
  reg temp0, temp1
  add 0;temp0
  add 0;temp1
  add n>>1;nn
  reg temp19:1
  nfor 10;nn;i
    reg xx, yy, ii
    reg temp2, temp3, temp4, temp5, temp6, temp7,
      temp8:16, temp9, temp10:16, temp11, temp12, temp13,
      temp14, temp15:16, temp16, temp17:16, temp18
    add 0;temp2
    add 0;temp3
    add y;temp4
    add temp4;yy
    add x;temp5
    add temp5;xx
    add i<<1;ii
    add ii<<1,temp4;temp6
    add ii<<1,temp5;temp7
    read 0;2; temp7; _mem_sync_x_0:1u; temp8;
      _mem_sync_x_1:1u // x[(ii << 1)]
    multiply a,temp8;temp9
    read 0;2; temp6; _mem_sync_y_0:1u; temp10;
      _mem_sync_y_1:1u // y[(ii << 1)]
    add temp9,temp10;temp11
    write 0;2;temp6; _mem_sync_y_1:1u;temp11;
      _mem_sync_y_0:1u // y[(ii << 1)]
    add ii<<1,2;temp12
    add temp12,yy;temp13
    add temp12,xx;temp14
    read 0;2; temp14; _mem_sync_xx_0:1u; temp15;
      _mem_sync_xx_1:1u // xx[((ii << 1) + 2)]
    multiply a,temp15;temp16
    read 0;2; temp13; _mem_sync_yy_0:1u; temp17;
      _mem_sync_yy_1:1u // yy[((ii << 1) + 2)]
    add temp16,temp17;temp18
    write 0;2;temp13; _mem_sync_yy_1:1u;temp18;
      _mem_sync_yy_0:1u // yy[((ii << 1) + 2)]
    nowait _mem_sync_x_0:1u // no write
    nowait _mem_sync_y_0:1u // restrict
    nowait _mem_sync_y_1:1u // restrict
    nowait _mem_sync_yy_0:1u // restrict
    nowait _mem_sync_yy_1:1u // restrict
    nowait _mem_sync_xx_0:1u // no write
  end 10
  Or
   _mem_sync_x_1:1u, _mem_sync_y_0:1u, _mem_sync_yy_0:1u,
     _mem_sync_xx_1:1u; _mem_sync:1u
Exit iaxpy; _mem_sync:1u
```

Example 4

FIG. 7 is a functional block diagram of a circuit 600 generated from the intermediate language program code of Example 4. The circuit 600 exhibits increased parallelism over the circuit 600 from FIG. 6. However, the added parallelism results in increased congestion at the ports of the cache 602, as shown by the arbitration logic provided by the multiplexers 604, 606, and 608 at the ports of the cache. Multiplexer 604 arbitrates read access for read blocks 610 and 612, multiplexer 606 arbitrates read access for read blocks 614 and 616, and multiplexer 608 arbitrates access for write blocks 618 and 620.

The data path including read block 614 and multiplier block 622 is parallel to the path including read block 616 and multiplier block 624. However, even though the data paths are parallel, access to the cache 602 is arbitrated for read block 614 and read block 616. Thus, the parallelism is limited by access to the cache.

While it would be desirable in some applications to unroll the loop more than twice in order to implement further parallel hardware, the increase in parallel hardware would require additional layers for the arbitration logic, thereby creating a bottleneck at the cache. In the example, with the loop having been unrolled twice, a single level of multiplexers suffices for the arbitration. If the loop were unrolled further, for example, four times instead of two, an additional level of multiplexers would be required to arbitrate access to the cache for the four parallel paths.

In order to alleviate congestion at the cache, the embodiments of the present invention improve the cache structure by selecting a cache word size for which a single access request for a word of the cache accommodates the processing by two or more parallel hardware paths. In accordance with embodiments of the present invention applied to Example 4, the cache word size is chosen such that x[ii] and x[ii+1] are stored in one cache word, and y[ii] and y[ii+1] are stored in one word. Thus, instead of separate read circuits for reading x[ii], x[ii+1], y[ii], and y[ii+1] and the arbitration provided by the multiplexers 604 and 606, the read functions are combined into a single long read function that accesses one word of the cache. Since there is a single read function in this particular example, no arbitration is required and the multiplexer can be eliminated. The write blocks 618 and 620 are similarly combined into a single write block. In other example applications the arbitration complexity may be similarly reduced.

Where the compiler recognizes an opportunity to optimize a cache word size the generated intermediate language code specifies that word size, and longread and longwrite instructions are used instead of the cache read and write instructions described above. In the code from Example 4, the four cache read instructions are replaced with two longread instructions, and the two cache write instructions are replaced with one longwrite instruction. The following three instructions show the longread instructions and the longwrite instructions that replace the read and write instructions from Example 4:

```
longmemread 0;4;2;temp0; _mem_sync_x_0:1u; temp1;
    _mem_sync_x_1:1u // x[(ii] and x[ii+1]
longmemread 0;4;2; temp2; _mem_sync_y_0:1u;temp3;
    _mem_sync_y_1:1u // y[ii] and y[ii+1]
longmemwrite 0;2;temp6; _mem_sync_y_1:1u;temp11;
    _mem_sync_y_0:1u // y[ii] and y[ii+1]
```

FIG. 8 is a functional block diagram of a circuit 650 generated from the intermediate language program code of Example 4 in which the cache word size has been optimized and the read and write instructions have been replaced with longread and longwrite instructions.

Cache 652 shows that the word size has been established to store two data items in each word of the cache. For example, data items x[0] and x[1] are stored in word 0 and data items y[0] and y[1] are stored in word n. Longread block 654 reads two data items from the cache in a single request. The cache returns the word containing x[ii . . . ii+1] to the longread block, and the longread blocks splits the word into the two data items, x[ii] and x[ii+1], which are forwarded to the parallel multipliers 656 and 658 via the FIFO buffers 660 and 662, respectively.

No arbitration is required for reading x[ii] and x[ii+1] as present in the circuit 600 of FIG. 7. Thus, x[ii] and x[ii+1] data are provided in parallel to the multipliers 656 and 658. The longread block 664 similarly reads y[ii . . . ii+1] in parallel from the cache 652 and provides those values in parallel to the adders 670 and 672 via FIFO buffers 674 and 676, respectively.

The longwrite block 680 receives the output values in parallel from adders 670 and 672 via FIFO buffers 682 and 684, respectively. The values are combined into a single word for a write request to the cache 652. Thus, the arbitration logic shown in circuit 650 for the write blocks 618 and 620 is eliminated with the longwrite block 680.

Figure 9:
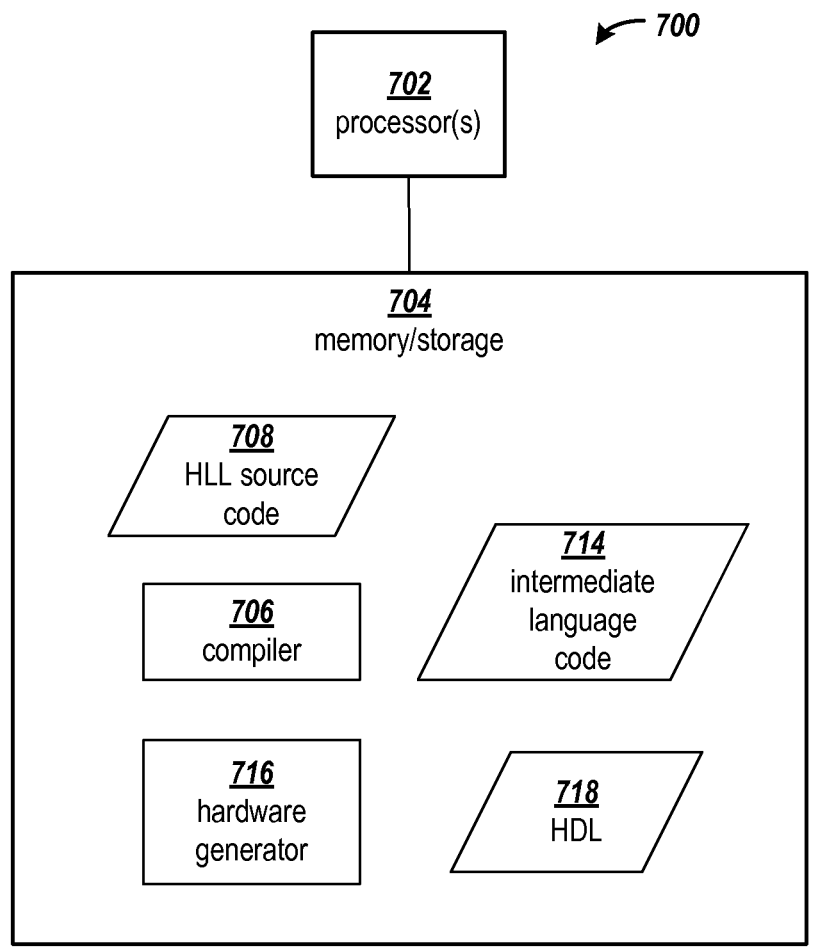
FIG. 9 is a block diagram of an example computing arrangement on which the processes described herein may be implemented.

FIG. 9 is a block diagram of an example computing arrangement 700 on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. In addition, program code that implements the processes may be provided via a variety of computer-readable storage media or delivery channels such as magnetic or optical disks or tapes, electronic storage devices, or as application services over a network.

Computing arrangement 700 includes one or more processors 702 coupled to a memory/storage arrangement 704. The architecture of the computing arrangement depends on implementation requirements as would be recognized by those skilled in the art. The processor 702 may be one or more general purpose processors, or a combination of one or more general purpose processors and suitable co-processors, or one or more specialized processors (e.g., RISC, pipelined, etc.).

The memory/storage arrangement 704 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor arrangement 702 executes the software stored in memory/storage arrangement 704, and reads data from and stores data to the memory/storage arrangement according to the processes described above. An operating system (not shown) manages the resources of the computing arrangement.

The processes described herein are implemented in one or more software modules for executing on the processor arrangement 702. For example, a compiler 706 processes the HLL source code 708 and generates intermediate language code 714. A hardware generator 716 processes the intermediate language code 714 and produces a hardware description language (HDL) file 718 that specifies a hardware implementation of one or more functions from the HLL source code. Additional software modules (not shown) may be used in further processing the HDL file into a description that is suitable for a specific hardware implementation.

Figure 10:
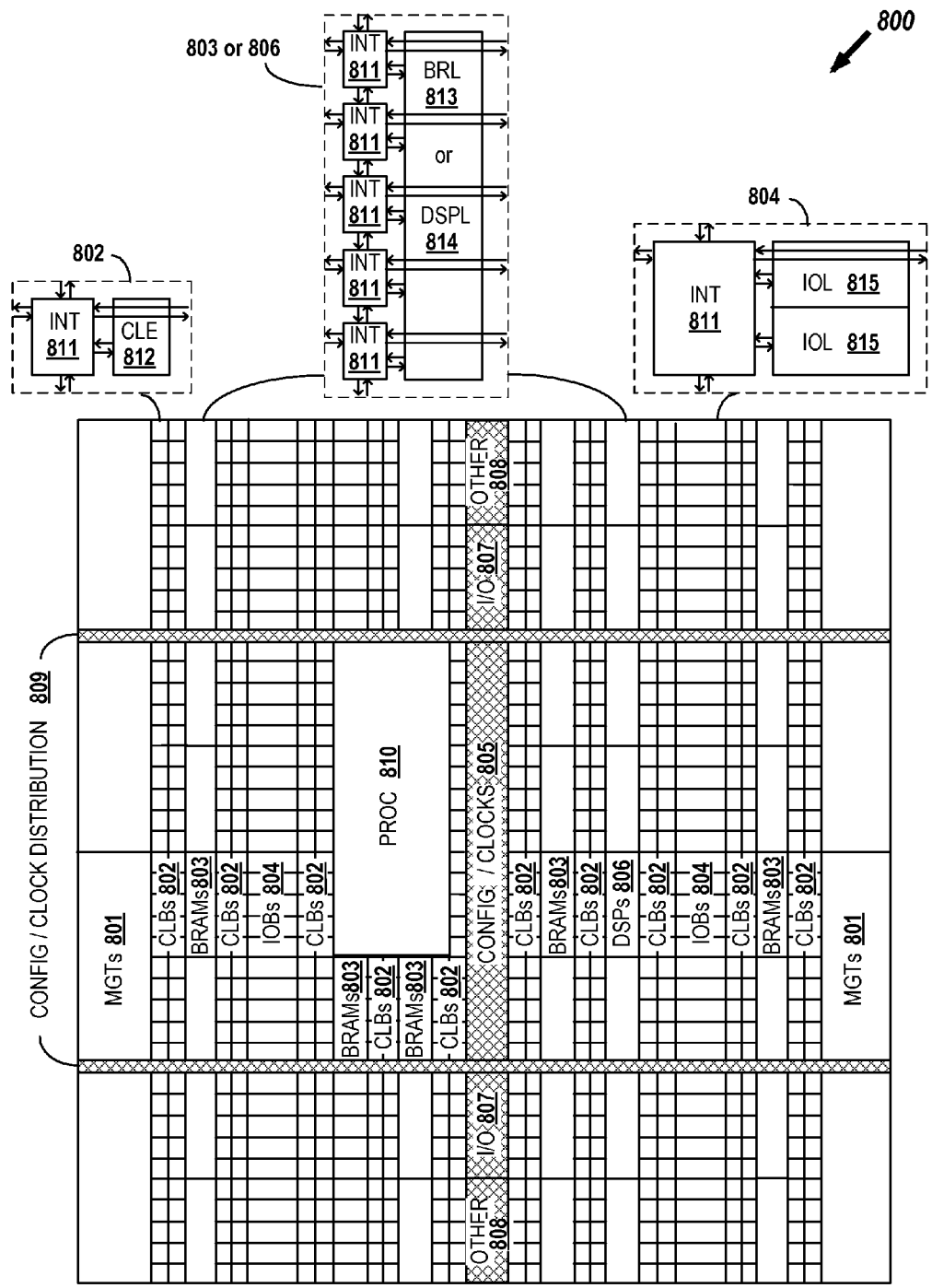
FIG. 10 illustrates an example FPGA architecture on which a many cache system may be implemented using the various approaches described herein.

FIG. 10 illustrates an example FPGA architecture 800 on which a system may be implemented using the various approaches described herein. Those skilled in the art will appreciate that the FPGA of FIG. 10 provides only one example of an integrated circuit device on which the methods of the present invention can be practiced. FPGA 800 includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include a hardwired processor 810.

In some FPGAs, each programmable tile includes a programmable interconnect element (INT 811) having standardized connections to and from a corresponding interconnect element in each adjacent tile. Therefore, the programmable interconnect elements taken together implement the programmable interconnect resources for the illustrated FPGA. The programmable interconnect element (INT 811) also includes the connections to and from the programmable logic primitive within the same tile, as shown by the examples included at the top of FIG. 10.

For example, a CLB 802 can include a configurable logic primitive (CLE 812) that can be programmed to implement user logic plus a single programmable interconnect element (INT 811). A BRAM 803 can include a BRAM logic primitive (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic primitive (DSPL 814) in addition to an appropriate number of programmable interconnect elements. An IOB 804 can include, for example, two instances of an input/output logic primitive (IOL 815) in addition to one instance of the programmable interconnect element (INT 811). As will be clear to those of skill in the art, the actual I/O pads connected, for example, to the I/O logic primitive 815 are manufactured using metal layered above the various illustrated logic blocks, and typically are not confined to the area of the input/output logic primitive 815.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, the processor block PROC 810 shown in FIG. 10 spans several columns of CLBs and BRAMs.

In the pictured embodiment, a columnar area near the center of the die (shown shaded in FIG. 10) is used for configuration, clock, and other control logic. Horizontal areas 809 extending from this column are used to distribute the clocks and configuration signals across the breadth of the FPGA.

Configuration port 818 may be used to access configuration memory in the FPGA 816 to configure the programmable logic and interconnect resources. In one embodiment, an internal scrubber (not shown) may continuously read and correct configuration memory via an internal configuration access port.

Note that FIG. 10 is intended to illustrate only an example FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely examples. For example, in an actual FPGA more than one adjacent column of CLBs is typically included wherever the CLBs appear, to facilitate the efficient implementation of user logic.

While the foregoing describes example embodiments in accordance with one or more aspects of the invention, other and further embodiments in accordance with the one or more aspects of the invention may be devised without departing from the scope thereof, which is determined by the claims that follow and equivalents thereof.

What is claimed is:

1. A method for generating a hardware specification from a high-level language (HLL) program, comprising:
    determining by a computing arrangement, separate accesses in the HLL program to at least two consecutively addressed data items, and that the consecutively addressed data items can be processed on parallel data paths;
    compiling the HLL program into an intermediate language program by the computing arrangement, the intermediate language program including two or more instructions that perform respective functions on the at least two consecutively addressed data items and a plurality of memory access instructions, one or more of the memory access instructions addressing one of the at least two consecutively addressed data items for access to all of the consecutively addressed data items; and
    generating a hardware specification from the intermediate language program by the computing arrangement, the hardware specification specifying:
        a cache memory that caches the at least two consecutively addressed data items in one addressable word of the cache memory;
        respective hardware blocks that implement the respective functions of the two or more instructions in the intermediate language program; and
        one or more respective memory access hardware blocks that implement the one or more memory access instructions;
    wherein each of the memory access hardware blocks is configured to generate a respective access request, and the cache memory accesses the at least two consecutively addressed data items in response to each access request, and at least two of the hardware blocks input the at least two consecutively addressed data items in parallel in the parallel data paths.

2. The method of claim 1, wherein the one or more memory access instructions include at least one read, and the respective memory access hardware block for the read separates the at least two consecutively addressed data items returned from the cache memory and outputs the at least two consecutively addressed data items on the parallel data paths.

3. The method of claim 1, wherein the one or more memory access instructions include at least one write, and the respective memory access hardware block for the write combines the at least two consecutively addressed data items received on the parallel data paths into a single cache-addressable word and initiates a write request to the cache memory.

4. The method of claim 1, wherein the at least two consecutively addressed data items are consecutive elements in an HLL-specified array.

5. The method of claim 1, wherein the at least two consecutively addressed data items are HLL single precision variables.

6. The method of claim 1, wherein the at least two consecutively addressed data items are HLL integer variables.

7. The method of claim 1, wherein:
    the compiling includes unrolling a program loop specified in the HLL program and specifying instructions for the unrolled loop in the intermediate language program; and
    the generating of the hardware specification includes generating the parallel data paths in which the at least two consecutively addressed data items are accessed.

8. The method of claim 1, wherein the hardware specification includes pipelined hardware blocks.

9. An article of manufacture, comprising:
    a non-transitory processor-readable storage medium configured with instructions for generating a hardware specification from a high-level language (HLL) program, the instructions when executed by one or more processors cause the one or more processors to perform operations including:
        determining separate accesses in the HLL program to at least two consecutively addressed data items, and that the consecutively addressed data items can be processed on parallel data paths;
        compiling the HLL program into an intermediate language program, the intermediate language program including two or more instructions that perform respective functions on the at least two consecutively addressed data items and a plurality of memory access instructions, one or more of the memory access instructions addressing one of the at least two consecutively addressed data items for access to all of the consecutively addressed data items; and
        generating a hardware specification from the intermediate language program, the hardware specification specifying:
            a cache memory that caches the at least two consecutively addressed data items in one addressable word of the cache memory;
            respective hardware blocks that implement the respective functions of the two or more instructions in the intermediate language program; and
            one or more respective memory access hardware blocks that implement the one or more memory access instructions;
        wherein each of the memory access hardware blocks is configured to generate a respective access request, and the cache memory accesses the at least two consecutively addressed data items in response to each access request, and at least two of the hardware blocks input the at least two consecutively addressed data items in parallel in the parallel data paths.

10. The article of manufacture of claim 9, wherein the one or more memory access instructions include at least one read, and the respective memory access hardware block for the read separates the at least two consecutively addressed data items returned from the cache memory and outputs the at least two consecutively addressed data items on the parallel data paths.

11. The article of manufacture of claim 9, wherein the one or more memory access instructions include at least one write, and the respective memory access hardware block for the write combines the at least two consecutively addressed data items received on the parallel data paths into a single cache-addressable word and initiates a write request to the cache memory.

12. The article of manufacture of claim 9, wherein the at least two consecutively addressed data items are consecutive elements in an HLL-specified array.

13. The article of manufacture of claim 9, wherein the at least two consecutively addressed data items are HLL single precision variables.

14. The article of manufacture of claim 9, wherein the at least two consecutively addressed data items are HLL integer variables.

15. The article of manufacture of claim 9, wherein:

the compiling includes unrolling a program loop specified in the HLL program and specifying instructions for the unrolled loop in the intermediate language program; and the generating of the hardware specification includes generating the parallel data paths in which the at least two consecutively addressed data items are accessed.

16. The article of manufacture of claim 9, wherein the hardware specification includes pipelined hardware blocks.

* * * * *